(12) United States Patent
Noh et al.

(10) Patent No.: US 7,718,341 B2
(45) Date of Patent: May 18, 2010

(54) LASER INDUCED THERMAL IMAGING APPARATUS AND MANUFACTURING METHOD OF ORGANIC LIGHT EMITTING DIODE USING THE SAME

(75) Inventors: Sok Won Noh, Seoul (KR); Seong Taek Lee, Yongin (KR); Mu Hyun Kim, Yongin (KR); Sun Hoe Kim, Jeongeup (KR); Myung Won Song, Yongin (KR); Jin Wook Seong, Seoul (KR); Tae Min Kang, Yongin (KR); Jin Soo Kim, Yongin (KR); Noh Min Kwak, Yongin (KR); Jae Ho Lee, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 773 days.

(21) Appl. No.: 11/510,372

(22) Filed: Aug. 24, 2006

(65) Prior Publication Data
US 2007/0048657 A1    Mar. 1, 2007

(30) Foreign Application Priority Data

Aug. 30, 2005 (KR) ................. 10-2005-0080339
Aug. 30, 2005 (KR) ................. 10-2005-0080340
Nov. 16, 2005 (KR) ................. 10-2005-0109813

(51) Int. Cl.
*G03F 7/00* (2006.01)
*G03F 7/004* (2006.01)

(52) U.S. Cl. .................. 430/199; 430/200; 430/270.1; 430/273.1

(58) Field of Classification Search .............. 430/270.1, 430/273.1, 199, 200
See application file for complete search history.

(56) References Cited

U.S. PATENT DOCUMENTS 3,927,943 A    12/1975    Pohl et al.

(Continued)

FOREIGN PATENT DOCUMENTS

CN    1591108 A    3/2005

(Continued)

OTHER PUBLICATIONS

Office action for China Patent Application No. 200610142214.8 issued by SIPO on May 9, 2008, with English translation, showing relevance of CN1638543A.
Patent Abstract of Japan for Publication No. 2004-296224, published on Oct. 21, 2004 in the name of Okada, et al.

(Continued)

*Primary Examiner*—Amanda C. Walke
(74) *Attorney, Agent, or Firm*—Christie, Parker & Hale, LLP

(57) ABSTRACT

A laser induced thermal imaging apparatus and a manufacturing method of organic light emitting diodes using the same, which reduce or prevent the occurrence of impurities or void between an acceptor substrate and a donor film while performing a laser induced thermal imaging in a vacuum state. A laser induced thermal imaging apparatus includes: a substrate stage including an acceptor substrate for receiving an imaging layer, the imaging layer being formed on the acceptor substrate, and an electromagnet, a donor film having a permanent magnet being placed and laminated on the substrate stage, and the electromagnet forming a magnetic force with a permanent magnet of the donor film; a laser oscillator for irradiating a laser to the donor film; and a chamber having at least the substrate stage located therein.

22 Claims, 16 Drawing Sheets

U.S. PATENT DOCUMENTS

| | | | |
|---|---|---|---|
| 4,377,339 | A | 3/1983 | Coppock |
| 4,975,637 | A | 12/1990 | Frankeny et al. |
| 5,725,979 | A | 3/1998 | Julich |
| 5,937,272 | A | 8/1999 | Tang |
| 6,270,934 | B1 | 8/2001 | Chang et al. |
| 6,509,142 | B2 | 1/2003 | Baxter et al. |
| 6,649,286 | B2 | 11/2003 | Kim et al. |
| 6,666,541 | B2 | 12/2003 | Ellson et al. |
| 6,688,365 | B2 | 2/2004 | Tyan et al. |
| 6,695,029 | B2 | 2/2004 | Phillips et al. |
| 6,911,667 | B2 * | 6/2005 | Pichler et al. ............ 257/40 |
| 6,939,649 | B2 | 9/2005 | Hotta et al. |
| 7,217,334 | B2 | 5/2007 | Toyoda |
| 7,396,631 | B2 * | 7/2008 | Wright et al. ............ 430/200 |
| 7,502,043 | B2 | 3/2009 | Noh et al. |
| 2002/0030440 | A1 | 3/2002 | Yamazaki |
| 2003/0042849 | A1 | 3/2003 | Ogino |
| 2004/0150311 | A1 | 8/2004 | Jin |
| 2005/0007442 | A1 | 1/2005 | Kay et al. |
| 2005/0048295 | A1 | 3/2005 | Kim et al. |
| 2005/0087289 | A1 | 4/2005 | Toyoda |
| 2005/0133802 | A1 | 6/2005 | Lee et al. |
| 2005/0153472 | A1 | 7/2005 | Yotsuya |
| 2005/0181587 | A1 | 8/2005 | Duan et al. |
| 2006/0063096 | A1 | 3/2006 | Lee et al. |
| 2007/0009671 | A1 | 1/2007 | Manz |
| 2007/0046770 | A1 | 3/2007 | Noh et al. |

FOREIGN PATENT DOCUMENTS

| | | | |
|---|---|---|---|
| CN | 16385543 A | | 7/2005 |
| EP | 749847 A1 * | | 12/1996 |
| EP | 0 790 138 A1 | | 8/1997 |
| JP | 05-138959 | | 6/1993 |
| JP | 08-123000 | | 5/1996 |
| JP | 09-167684 | | 6/1997 |
| JP | 10-039791 | | 2/1998 |
| JP | 10-41069 | | 2/1998 |
| JP | 10-055888 | | 2/1998 |
| JP | 11-054275 | | 2/1999 |
| JP | 11-158605 | | 6/1999 |
| JP | 2000-096211 | | 4/2000 |
| JP | 2002-075636 | | 3/2002 |
| JP | 2002-198174 | | 7/2002 |
| JP | 2002-260921 | | 9/2002 |
| JP | 2003-076297 | | 3/2003 |
| JP | 2003-077658 | | 3/2003 |
| JP | 2003-187973 | | 7/2003 |
| JP | 2004-079540 | | 3/2004 |
| JP | 2004-087143 | | 3/2004 |
| JP | 2004-296224 | | 10/2004 |
| JP | 2004-355949 | | 12/2004 |
| JP | 2005-005245 | | 1/2005 |
| JP | 2005-085799 | | 3/2005 |
| JP | 2005-183381 | | 7/2005 |
| TW | 369483 | | 9/1999 |

OTHER PUBLICATIONS

Patent Abstract of Japan for Publication No. 2004-355949, published on Dec. 16, 2004 in the name of Ebisawa, et al.

Lee, Seong Taek et al., "21.3: A New Patterning Method for Full-Color Polymer Light-Emitting Devices: Laser Induced Thermal Imaging (LITI)"; SID 02 Digest, 4pp.

Lee, Seong Taek et al., "29.3: A Novel Patterning Method for Full-Color Organic Light-Emitting Devices: Laser Induced Thermal Imaging (LITI)"; SID 00 Digest, 4pp.

Japanese Office action dated Aug. 25, 2009, for corresponding Japanese application 2006-061329.

Taiwan Office action dated Jul. 28, 2009, for corresponding Taiwan application 095131694.

SIPO Office action dated Nov. 7, 2008, for Chinese application 200610136976, with English translation of text, noting listed Chinese reference in this IDS.

Japanese Office action dated Mar. 24, 2009, for Japanese application 2006-061367.

U.S. Office action dated Aug. 20, 2008, for related U.S. Appl. No. 11/509,463, noting listed U.S. Patent 4,975,637 listed in this IDS.

U.S. Office action dated Sep. 19, 2008, for related U.S. Appl. No. 11/508,159 (now issued as U.S. Patent 7,502,043), noting listed reference in this IDS, namely, U.S. Patent 6,666,541.

Sep. 29, 2008 response to U.S. Office action dated Sep. 19, 2008 for related U.S. Appl. No. 11/508,159 (now issued as U.S. Patent 7,502,043).

U.S. Office action dated Feb. 8, 2008, for related U.S. Appl. No. 11/512,991.

U.S. Office action dated Nov. 28, 2008, for related U.S. Appl. No. 11/512,991, noting listed U.S. Publication 2005/0181587 listed in this IDS.

U.S. Office action dated Feb. 23, 2009, for related U.S. Appl. No. 11/509,463, noting listed U.S. Publication 2003/0042849 listed in this IDS.

U.S. Office action dated May 18, 2009, for related U.S. Appl. No. 11/507,792.

U.S. Office action dated May 21, 2009, for related U.S. Appl. No. 11/509,463, noting listed U.S. Patents 3,927,943 and 5,725,979 listed in this IDS.

Japanese Office action dated May 12, 2009, for Japanese application 2006-080211.

Niko et al., *White light and red-green-blue (RGB) electroluminescence by light color-conversion*, Optical Materials, vol. 9, (1998), pp. 188-191.

Japanese Office action dated Jun. 2, 2009, for Japanese application 2006-234478.

Taiwan Office action dated Jul. 28, 2009, for Taiwan application 095131945.

* cited by examiner

LASER INDUCED THERMAL IMAGING APPARATUS AND MANUFACTURING METHOD OF ORGANIC LIGHT EMITTING DIODE USING THE SAME

CROSS-REFERENCE TO RELATED APPLICATIONS

This application claims priority to and the benefit of Korean Patent Application Nos. 10-2005-0080339 and 10-2005-0080340, both of which were filed on Aug. 30, 2005, and 10-2005-0109813, filed on Nov. 16, 2005, in the Korean Intellectual Property Office, the entire contents of all of which are incorporated herein by reference.

BACKGROUND

1. Field of the Invention

The present invention relates to a laser induced thermal imaging apparatus and a manufacturing method of an organic light emitting diode using the same, and more particularly, to a laser induced thermal imaging apparatus and a manufacturing method of an organic light emitting diode using the same, which laminate an acceptor substrate and a donor film using a magnetic force.

2. Discussion of Related Art

An organic light emitting device includes a light emitting layer formed between first and second electrodes and emits light when a voltage is applied between the electrodes. A laser induced thermal imaging (LITI) process may be used to fabricate the organic light emitting device.

In a laser induced thermal imaging method, a laser is radiated to a donor substrate including a base substrate, a light-to-heat conversion layer (LTHC) and a transfer layer (or imaging layer) to convert the laser that passes through the base substrate into heat at the light-to-heat conversion layer, such that the light-to-heat conversion layer is deformed and expanded. This way, the transfer layer adjacent to the light-to-heat conversion layer is also deformed and expanded, and transferred (or imaged on) the acceptor substrate.

When performing the laser induced thermal imaging method, a chamber in which the transfer is performed should generally become a vacuum state. However, in the prior art, there has been a problem in that the transfer layer is not transferred well because space (or gap) or impurities are created between the donor substrate and the accepter substrate when a laser-to-heat conversion is performed in the vacuum state. Therefore, in the laser induced thermal imaging method, a method of laminating the donor and accepter substrates is important, and to resolve the problems with the space or the impurities, various methods have been investigated.

FIG. 1 is a cross-sectional view that shows a prior art laser induced thermal imaging apparatus 10 for resolving the above-mentioned problem. According to FIG. 1, the laser induced thermal imaging apparatus 10 includes a substrate stage 12 placed in a chamber 11 and a laser radiating apparatus 13 placed at an upper portion of the chamber 11. The substrate stage 12 is a stage for placing an accepter substrate 14 and a donor film 15 introduced in the chamber 11 in turn.

The accepter substrate 14 and the donor film 15 are laminated to each other prior to transferring the transfer layer of the donor film 15 to the acceptor substrate 14. During lamination, the chamber 11 is typically not maintained in the vacuum state, but a vacuum pump P is used to absorb impurities. Since the chamber is not in a vacuum state during lamination, the reliability or the lifetime of the resulting organic light emitting device can be reduced because of oxygen, moisture, or the like in the chamber 11.

On the other hand, when the chamber 11 is maintained in the vacuum state during lamination, it is difficult to absolutely prevent creation of impurities 1 and space between the accepter substrate 14 and the donor film 15.

SUMMARY OF THE INVENTION

Accordingly, it is an aspect of the present invention to provide a laser induced thermal imaging apparatus and a manufacturing method of organic light emitting diodes using the same, which prevent the occurrence of impurities or void between an acceptor substrate and a donor film while performing a laser induced thermal imaging in a vacuum state.

The foregoing and/or other aspects of the present invention are achieved in one embodiment by providing a laser induced thermal imaging donor film including: a photo-thermal conversion layer located between a base substrate and an imaging layer, wherein a permanent magnet is formed in the laser induced thermal imaging donor film.

According to another aspect of the present invention, there is provided a laser induced thermal imaging apparatus including: a substrate stage adapted to receive an acceptor substrate for receiving an imaging layer, the substrate stage having an electromagnet and further adapted to receive a donor film having the imaging layer and a permanent magnet, the electromagnet for forming a magnetic force with the permanent magnet of the donor film; a laser oscillator for irradiating a laser to the donor film; and a chamber adapted to receive at least the substrate stage therein.

According to another aspect of the present invention, there is provided a laser induced thermal imaging method for irradiating a laser to a donor film having an imaging layer to transfer the imaging layer on an acceptor substrate, the method including: placing the acceptor substrate on a substrate stage having at least one electromagnet; placing a laser induced thermal imaging donor film having a permanent magnet on the acceptor substrate; applying a power to the electromagnet of the substrate stage to laminate the donor film and the acceptor substrate; and irradiating a laser to the donor film to transfer the imaging layer on the acceptor substrate.

According to another aspect of the present invention, there is provided a method for fabricating an organic light emitting diode having an emission layer formed between a first electrode and a second electrode by a laser induced thermal method, the method including: placing an acceptor substrate having a pixel region on a substrate stage having at least one electromagnet; placing a donor film having a permanent magnet and an emission layer on the acceptor substrate; applying a power to the electromagnet of the substrate stage to laminate the donor film and the acceptor substrate; and irradiating a laser to the donor film to transfer an organic emission layer on the pixel region of the acceptor substrate.

According to another aspect of the present invention, there is provided a laser induced thermal imaging donor film including: a photo-thermal conversion layer located between a base substrate and an imaging layer, wherein a first electromagnet is formed in the laser induced thermal imaging donor film.

According to another aspect of the present invention, there is provided a laser induced thermal imaging apparatus including: a substrate stage adapted to receive an acceptor substrate for receiving an imaging layer, the substrate stage having a second electromagnet and further adapted to receive a donor film having the imaging layer and a first electromagnet, the second electromagnet for forming a magnetic force with the first electromagnet of the donor film; a laser oscillator for irradiating a laser to the donor film; and a chamber adapted to receive at least the substrate stage therein.

According to another aspect of the present invention, there is provided a laser induced thermal imaging method for irradiating a laser to a donor film having an imaging layer to transfer the imaging layer on an acceptor substrate, the method including: placing the acceptor substrate on a substrate stage having at least one second electromagnet; placing a laser induced thermal imaging donor film having a first electromagnet on the acceptor substrate; applying a power to the first electromagnet of the donor film and the second electromagnet of the substrate stage to laminate the donor film and the acceptor substrate; and irradiating a laser to the donor film to transfer the imaging layer on the acceptor substrate.

According to another aspect of the present invention, there is provided a method for fabricating an organic light emitting diode having an emission layer formed between a first electrode and a second electrode by a laser induced thermal method, the method including: placing an acceptor substrate having a pixel region on a substrate stage having at least one second electromagnet; placing a donor film having a first electromagnet and an emission layer on the acceptor substrate; applying a power to the first electromagnet of the donor film and the second electromagnet of the substrate stage to laminate the donor film and the acceptor substrate; and irradiating a laser to the donor film to transfer an organic emission layer on the pixel region of the acceptor substrate.

According to another aspect of the present invention, there is provided a laser induced thermal imaging apparatus including: a substrate stage adapted to receive an acceptor substrate for receiving an imaging layer, the substrate stage having a permanent magnet and further adapted to receive a donor film having the imaging layer and an electromagnet, the permanent magnet for forming a magnetic force with the electromagnet of the donor film; a laser oscillator for irradiating a laser to the donor film; and a chamber adapted to receive at least the substrate stage therein.

According to another aspect of the present invention, there is provided a laser induced thermal imaging method for irradiating a laser to a donor film having an imaging layer to transfer the imaging layer on an acceptor substrate, the method including: placing the acceptor substrate on a substrate stage having at least one permanent magnet; placing a laser induced thermal imaging donor film having an electromagnet on the acceptor substrate; applying a power to the first electromagnet of the donor film to laminate the donor film and the acceptor substrate; and irradiating a laser to the donor film to transfer the imaging layer on the acceptor substrate.

According to another aspect of the present invention, there is provided a method for fabricating an organic light emitting diode having an emission layer formed between a first electrode and a second electrode by a laser induced thermal method, the method including: placing an acceptor substrate having a pixel region on a substrate stage having at least one permanent magnet; placing a donor film having an electromagnet and an emission layer on the acceptor substrate; applying a power to the electromagnet of the donor film to laminate the donor film and the acceptor substrate; and irradiating a laser to the donor film to transfer an organic emission layer on the pixel region of the acceptor substrate.

According to another aspect of the present invention, there is provided a laser induced thermal imaging apparatus including: a substrate stage adapted to receive an acceptor substrate for receiving an imaging layer, the substrate stage including a second permanent magnet and further adapted to receive a donor film having the imaging layer and a first permanent magnet, the second permanent magnet for forming a magnetic force with the first permanent magnet of the donor film; a laser oscillator for irradiating a laser to the donor film; and a chamber adapted to receive at least the substrate stage therein.

According to another aspect of the present invention, there is provided a laser induced thermal imaging method for irradiating a laser to a donor film having an imaging layer to transfer the imaging layer on an acceptor substrate, the method including: placing the acceptor substrate on a substrate stage having at least one second permanent magnet; placing a laser induced thermal imaging donor film having a first permanent magnet on the acceptor substrate; laminating the acceptor substrate by a magnetic force of the first permanent magnet of the donor film and the substrate stage having the second permanent magnet; and irradiating a laser to the donor film to transfer the imaging layer on the acceptor substrate.

BRIEF DESCRIPTION OF THE DRAWINGS

These and/or other aspects and features of the invention will become apparent and more readily appreciated from the following description of certain exemplary embodiments, taken in conjunction with the accompanying drawings of which.

DETAILED DESCRIPTION

Figure 1:
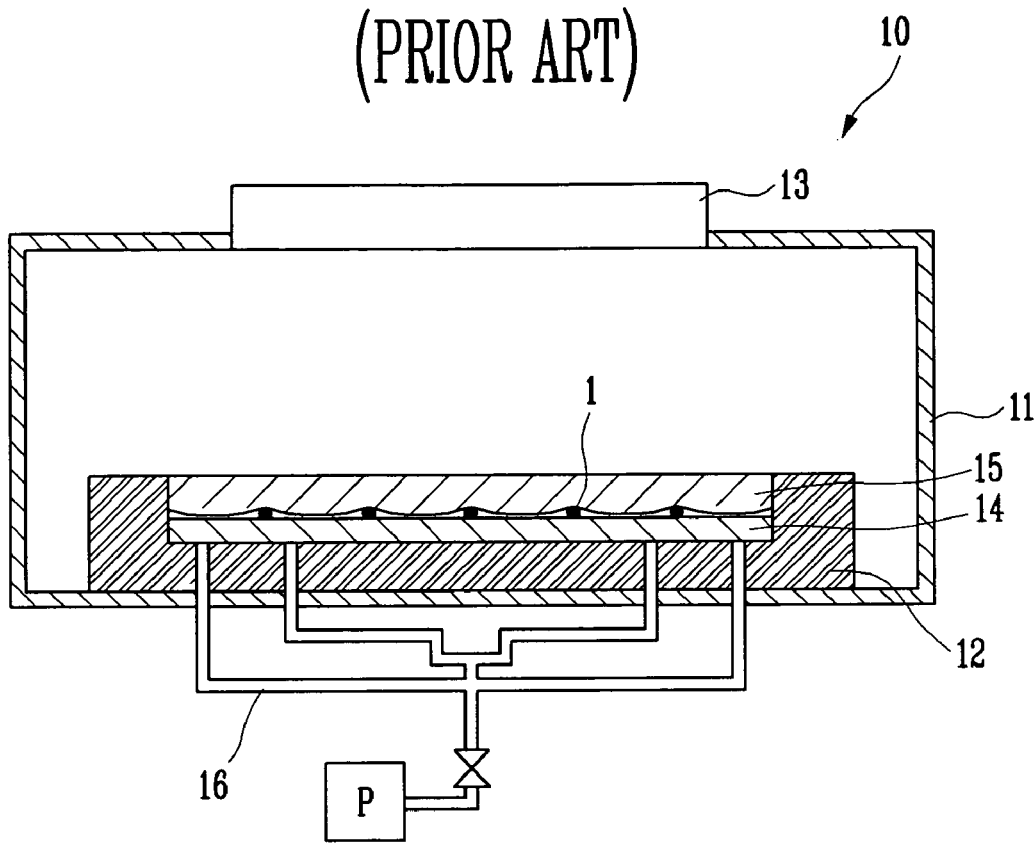
FIG. 1 is a partial cross-sectional view showing a conventional laser induced thermal imaging apparatus.

Hereinafter, certain exemplary embodiments according to the present invention will be described with reference to the accompanying drawings. In this application, when one element is described as being connected to another element, one element may be directly connected to another element, or may be indirectly connected to another element via a third element. Some of the parts that are not essential to the understanding of the invention have been omitted from the drawings for clarity. Also, like reference numerals refer to like elements throughout.

FIGS. 2A to 2D are cross-sectional views showing a laser induced thermal imaging donor film according to one aspect of the present invention.

First, a laser induced thermal imaging donor film having a permanent magnet according to one aspect of the present invention will now be described. The donor film is a film having an imaging layer to be transferred on an acceptor substrate. The donor film includes a base substrate, a photo-thermal conversion layer (i.e., light-to heat conversion layer), and a transfer layer (or imaging layer), which are sequentially laminated. In order to enhance a performance, a buffer layer and/or an inter layer may be further formed between the photo-thermal conversion layer and the imaging layer.

Here, the laser induced thermal imaging donor film may include a permanent magnet. In this case, at least one permanent magnet layer may be formed between a plurality of layers of the donor film or a permanent magnet made of minute particles (e.g., nano particles) may be included in at least one of the plurality of layers.

Figure 2A:
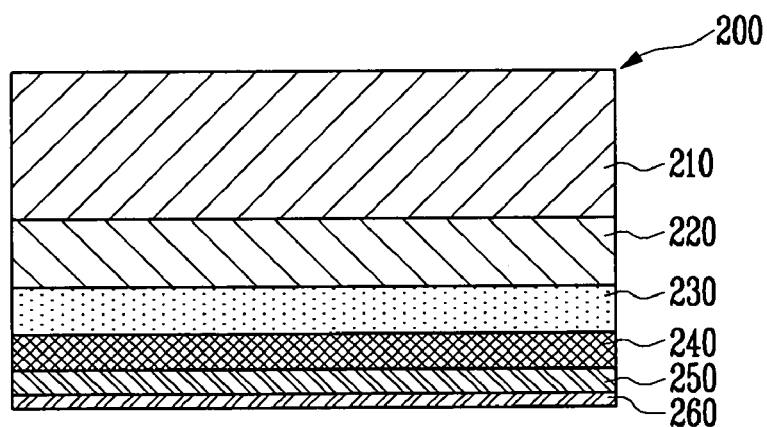
FIGS. 2A to 2D are cross-sectional views showing a laser induced thermal imaging donor film according to one aspect of the present invention.

FIG. 2A is a cross-sectional view showing a laser induced thermal imaging donor film 200 according to one embodiment of the present invention. As shown in FIG. 2A, the donor film 200 includes a photo-thermal conversion layer (or laser-to-heat conversion layer) 220, a permanent magnet layer 230, a buffer layer 240, an inter layer 250, and an imaging layer (or transfer layer) 260, which are sequentially laminated on the base substrate 210.

The base substrate 210 is a substrate for supporting the donor film. In one embodiment, the base substrate 210 is formed of transparent macro molecules, and has 10 to 500 μm in thickness. Transparent macro molecules such as polyethylene, polyester, polyacrylic, polyepoxy, or polystyrene can be used, but is not limited thereto.

The photo-thermal conversion layer 220 is formed of optical adsorption material, which adsorbs and converts a laser beam to heat. A thickness of the photo-thermal conversion layer 220 can vary according to the optical adsorption material used and a formation method. When the photo-thermal conversion layer 220 is formed of a metal or a metallic oxide, it may be formed using vacuum deposition, electron beam deposition, or sputtering to have a thickness of 100 to 5000 Å (or 0.01 to 0.5 μm). When the photo-thermal conversion layer 220 is formed using an organic film, it may be formed using extrusion, gravure, spin, knife coating to have 0.1 to 2 μm in thickness.

When the thickness of the photo-thermal conversion layer 220 is less than the aforementioned range, since an energy absorption rate is low, an amount of photo-thermal converted energy is small, thereby lowering an expansion pressure. When the thickness of the photo-thermal conversion layer 220 is greater than the range, an edge open defect can occur due to a deviation occurring between the donor film and the acceptor substrate.

One or more of aluminum, silver, chromium, tungsten, tin, nickel, titanium, cobalt, zinc, gold, copper, molybdenum, lead, and an oxide thereof may be used as the optical adsorption material formed of the metal or the metallic oxide, which have an optical density of 0.1 to 0.4.

Further, a carbon black, graphite, or macro molecule having infrared dye may be used as the optical adsorption material formed by an organic film. Also, (meta)acrylrate oligomer such as acryl (meta)acrylrate oligomer, ester (meta)acrylrate oligomer, epoxy (meta)acrylrate oligomer, urethane (meta) acrylrate oligomer, and a mixture of oligomer (meta)acrylrate monomer may be used as formation material of macro molecule bonding resin, but not limited thereto.

The permanent magnet layer 230 is inserted to form a mutual magnetic force with an electromagnet to be installed on a substrate stage of a laser induced thermal imaging apparatus to be described later. Alnicon magnet, ferrite magnet, rare-earth magnet, rubber magnet, or plastic magnet may be used as the permanent layer 230, but is not limited thereto.

The buffer layer 240 functions to improve transfer characteristic of an imaging layer, and to enhance a life of a device after transfer. A metal oxide, a metal sulfide, or non-metal inorganic compound, macro or micro molecule organic material can be used as the buffer layer 240. In one embodiment, the buffer layer has a thickness of 0.01 to 2 μm.

The inter layer 250 functions to protect the photo-thermal conversion layer. In one embodiment, the inter layer 250 has a high thermal resistance. The inter layer 250 may be configured using organic or inorganic film.

The imaging layer 260 is separated from the donor film and is transferred to an acceptor substrate. When the imaging layer 260 is used to manufacture an organic light emitting diode, so as to form an emission layer, it can be formed by macro or micro molecule organic emission material. In order to form an electron transport layer (ETL), an electron inject layer (EIL), a hole transport layer (HTL), and a hole inject layer (HIL), the imaging layer 260 may be formed by any suitable material known to those skilled in the art. Here, there is no limit to the material of the imaging layer 260. Materials known to those skilled in the art are permitted. Extrusion, gravure, spin, knife coating, vacuum deposition, or CVD may be used to form the imaging layer 260.

As described above, by inserting the permanent magnet layer 230 into the donor film 200, the donor film 200 has magnetic characteristic. Accordingly, when the donor film 200 is positioned on or over the acceptor substrate, it forms a mutual magnetic attraction with a substrate stage of a laser induced thermal imaging apparatus having an electromagnet. As a result, the donor film and the acceptor substrate are adhered closely to each other using a magnetic force.

Figure 2B:
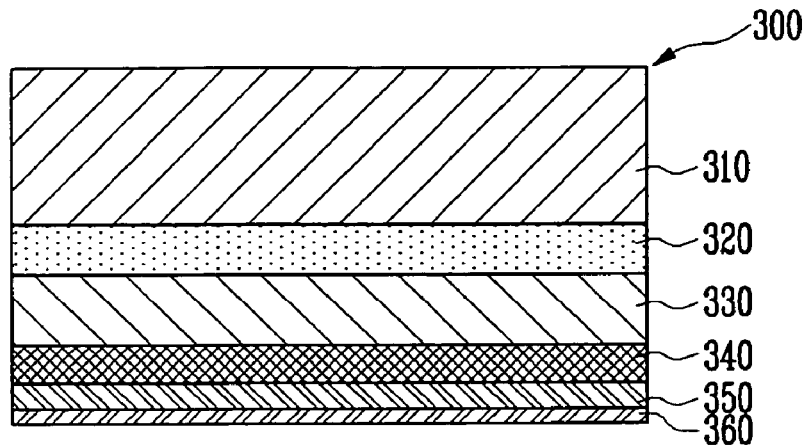

FIG. 2B is a cross-sectional view showing a laser induced thermal imaging donor film 300 according to another embodiment of the present invention. Unlike the permanent magnet layer 230 formed between the photo-thermal conversion layer 220 and the buffer layer 240, a permanent magnet layer 320 is formed between a photo-thermal conversion layer 330 and a base substrate 310. Except that, the laser induced thermal imaging donor film 300 of FIG. 2B is substantially the same as that of FIG. 2A, and includes a buffer layer 340, an inter layer 350 and an imaging layer 360. Accordingly, a detailed description thereof is omitted.

Figure 2C:
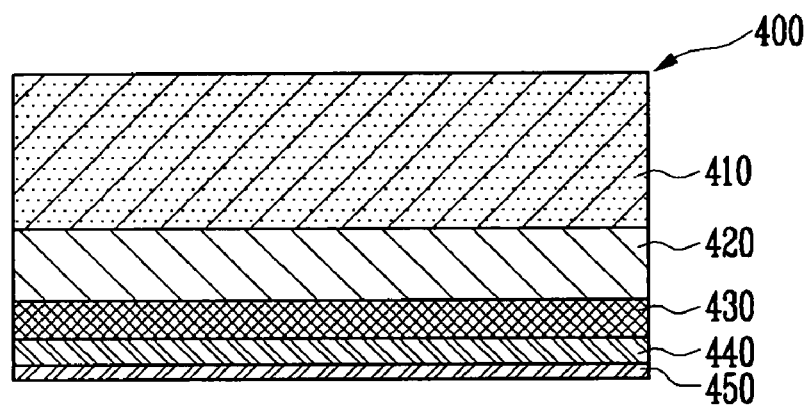

FIG. 2C is a cross-sectional view showing a laser induced thermal imaging donor film 400 according to another embodiment of the present invention. In FIGS. 2A and 2B, one layer forms the permanent magnet. In contrast to this, the permanent magnet is dispersed in a base substrate 410 in a form of minute particles.

That is, forming the permanent magnet in transparent high molecules constituting the base substrate 410 using minute particles to have magnetic characteristic dispersed in the donor film 400. Here, the permanent magnet may be formed using nano particles. The donor film 400 includes a photo-thermal conversion layer 420, a buffer layer 430, an inter layer 440 and an imaging layer 450.

Figure 2D:
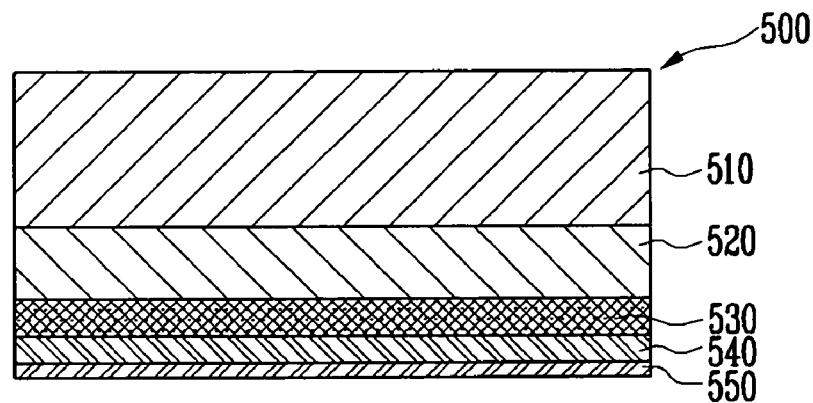

FIG. 2D is a cross-sectional view showing a laser induced thermal imaging donor film 500 according to another embodiment of the present invention. Unlike minute particles of the permanent magnet dispersed in the base substrate 410 in FIG. 2C, minute particles of the permanent magnet are dispersed at a buffer layer 530 in FIG. 2D. Accordingly, it would be appreciated by those skilled in the art that the donor film 500 of FIG. 2D has substantially the same effect (e.g., magnetic characteristic) as that of FIG. 2C. The donor film 500 includes a base substrate 510, on which a photo-thermal conversion layer 520, the buffer layer 530, an inter layer 540 and an imaging layer 550 are disposed or formed.

Next, a laser induced thermal imaging apparatus according to another aspect of the present will be described with reference to drawings. A laser induced thermal imaging apparatus is an apparatus to use the aforementioned laser induced thermal imaging donor film. However, the laser induced thermal imaging donor film is not limited in its use thereto.

Figure 3:
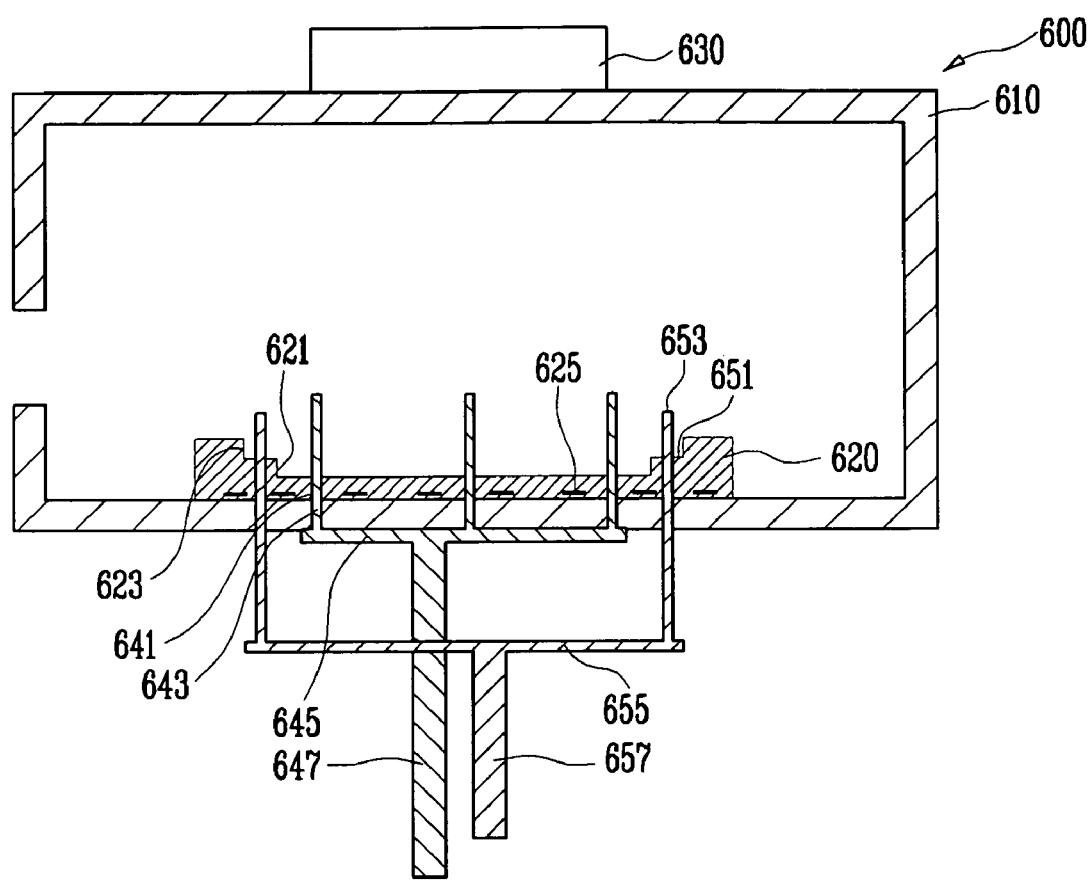
FIG. 3 is a cross-sectional view showing a construction of a laser induced thermal imaging apparatus according to another aspect of the present invention.

FIG. 3 is a cross-sectional view showing a construction of a laser induced thermal imaging apparatus 600 according to another aspect of the present invention. As shown in FIG. 3, the laser induced thermal imaging apparatus 600 includes a chamber 610, a substrate stage 620, and a laser oscillator 630.

Figure 6A:
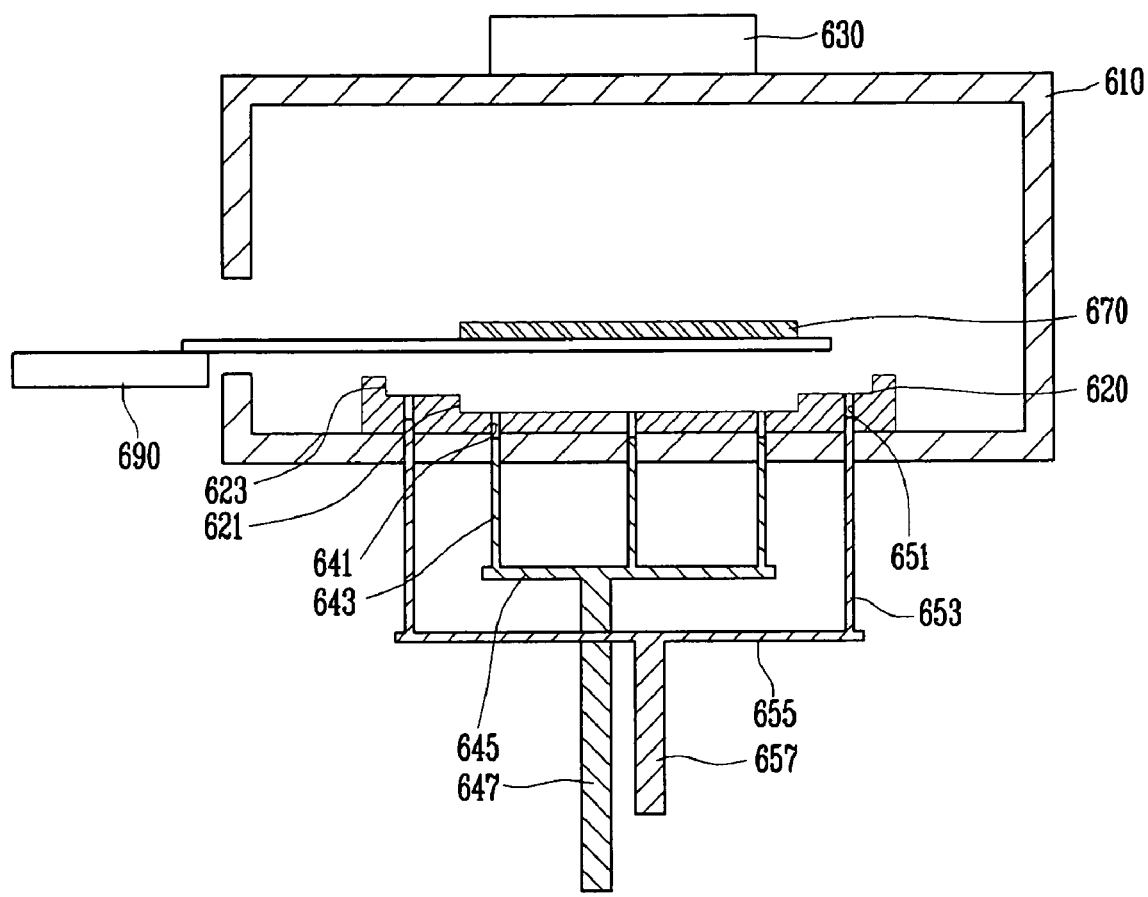
FIGS. 6A to 6H are cross-sectional views that show a fabricating method of an organic light emitting diode according to a further embodiment of the present invention.
Figure 6B:
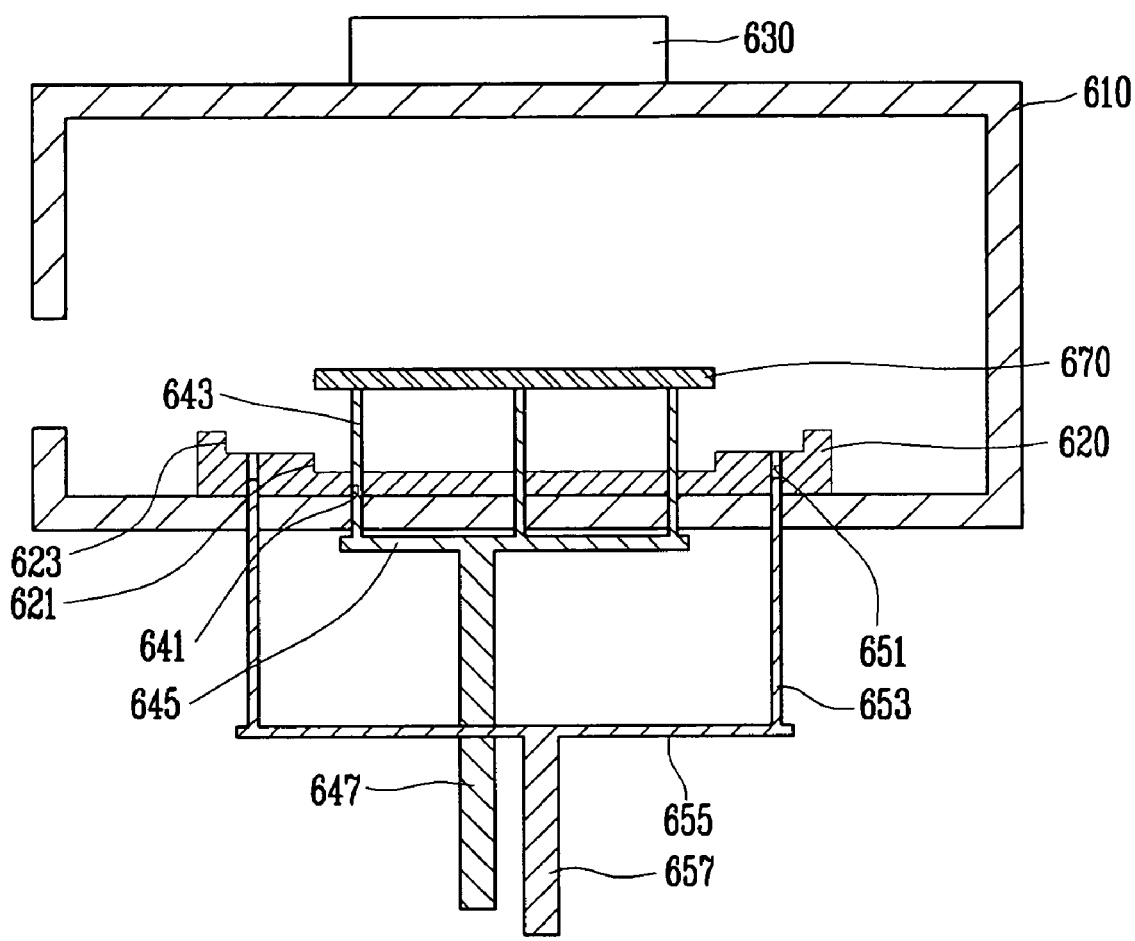
Figure 6C:
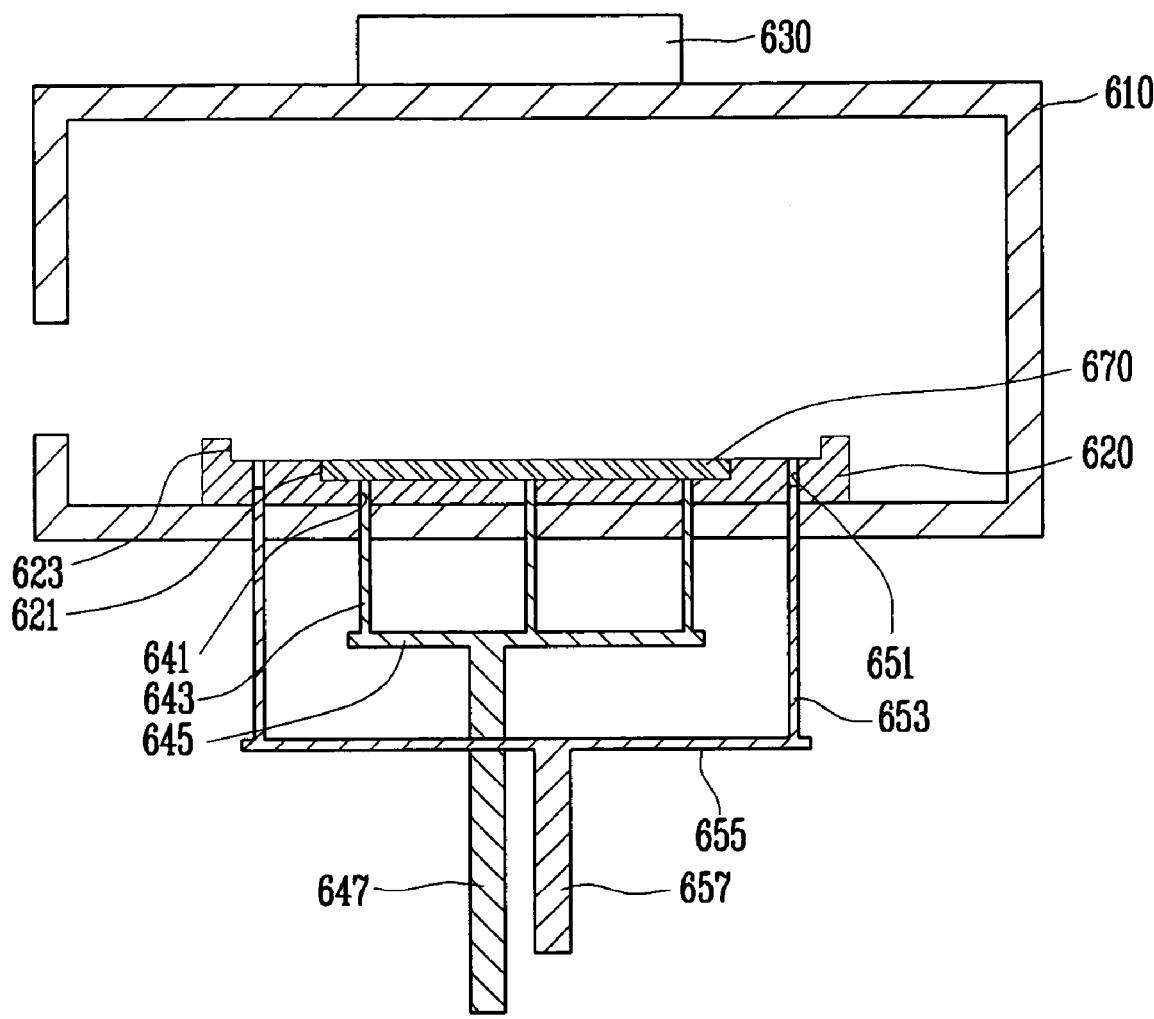

A chamber for a typical laser induced thermal imaging apparatus can be used as the chamber 610. A conveying mechanism (or feeding or transferring mechanism) such as a robot arm (shown in FIG. 6A) is installed at an outside of the chamber 610 and conveys (or feeds or moves) a donor film having a permanent magnet (not shown in FIG. 3) and an acceptor substrate (not shown in FIG. 3).

A substrate stage 620 is disposed at or near a lower surface of the chamber 610, and at least one electromagnet 625 is mounted on the substrate stage 620. A large plane magnet or a plurality of magnets may form the electromagnet 625. There is no limit to an arrangement pattern of the electromagnetic layer 625. In one embodiment, the electromagnets are concentrically formed or formed in a plurality of transverse and longitudinal lines to perform laminating.

Figure 4A:
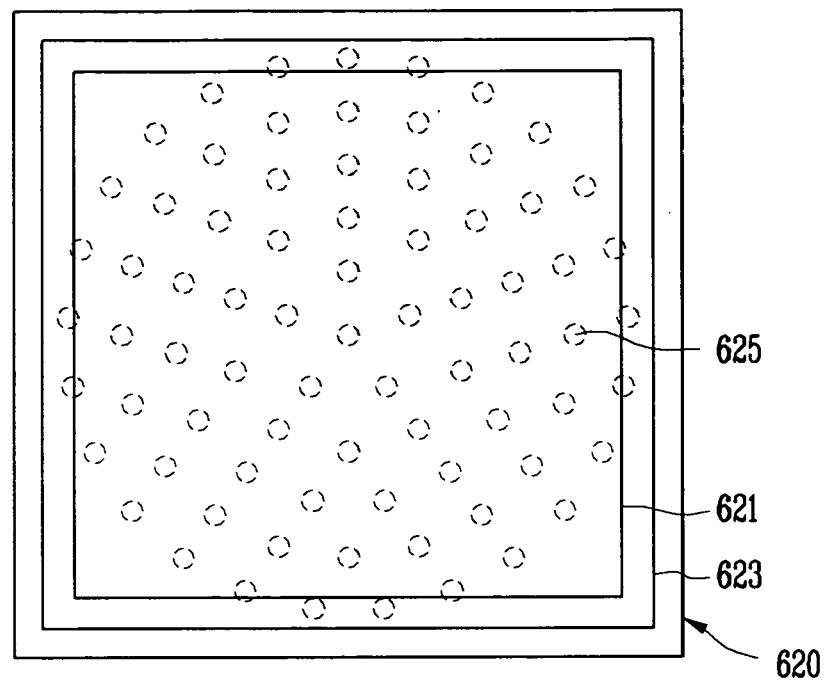
FIGS. 4A and 4B are plan views showing substrate stages according to an embodiment of the present invention.
Figure 4B:
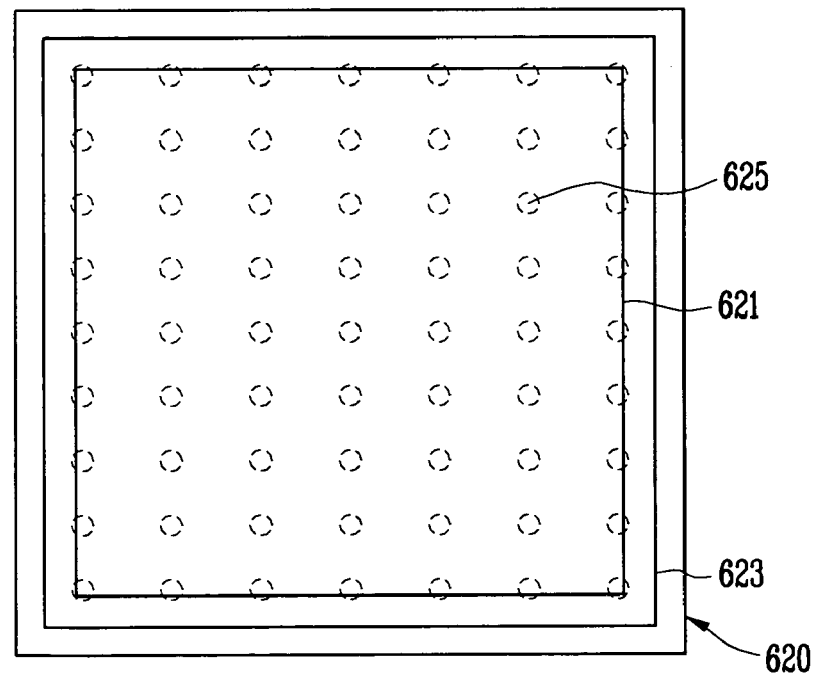

FIGS. 4A and 4B are plan views showing a pattern in which the electromagnets 625 are concentrically formed or formed in a plurality of lines in the substrate stage 620. Although it is not shown, wirings can be formed at respective electromagnets and apply a power thereto.

Returning now to FIG. 3, the substrate stage 620 may further include a drive mechanism (not shown) for moving the substrate stage. For example, when a laser is irradiated in a longitudinal direction, a drive mechanism for moving the substrate stage in a transverse direction may be provided.

Furthermore, the substrate stage 620 may also include an acceptor substrate mounting mechanism and a donor film mounting mechanism for positioning the acceptor substrate and the donor film on the substrate stage, respectively. In the described embodiment, the acceptor substrate mounting mechanism and the donor film mounting mechanism cause the acceptor substrate conveyed (or transferred or moved) into the chamber to be exactly mounted at a desired position (e.g., predetermined position) on the substrate stage.

In the described embodiment, the mounting mechanism includes through holes 641 and 651, guide bars 643 and 653, moving plates 645 and 655, support members 647 and 657, mounting grooves 621 and 623. The guide bars 643 and 653 respectively ascend or descend with the moving plates 645 and 655, and the support members 647 and 657. The guide bars 643 and 653 respectively ascend through the through holes 641 and 651, and respectively receive an acceptor substrate and a donor film. The guide bars 643 and 653 descend and the acceptor substrate and the donor film are respectively inserted into the mounting grooves 621 and 623. In order to exactly mount the acceptor substrate and the donor film, wall surfaces of the mounting grooves are slanted in one exemplary embodiment.

Figure 5:
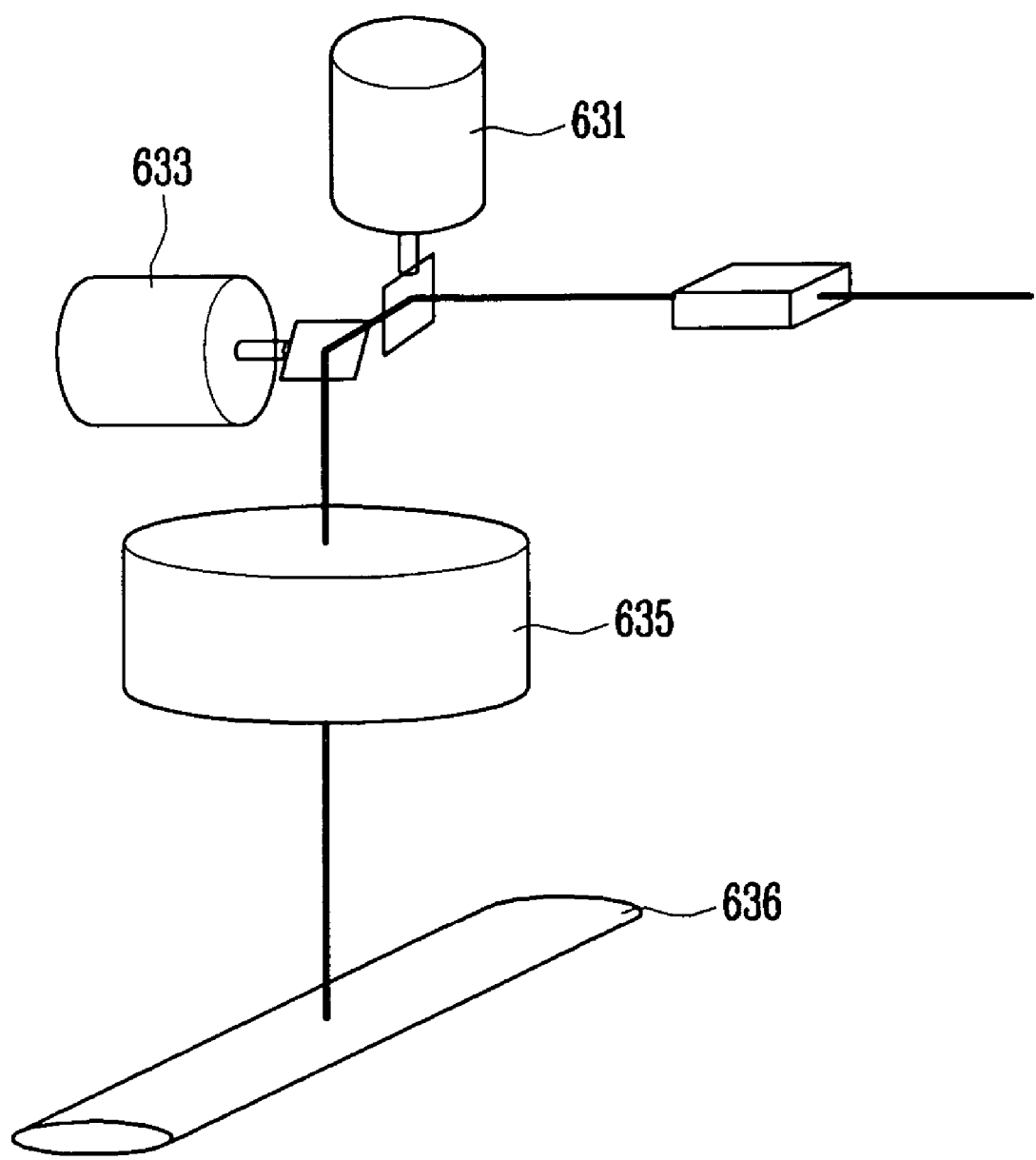
FIG. 5 is a schematic view showing a laser oscillator of the laser induced thermal imaging apparatus according to an embodiment of the present invention.

A laser oscillator 630 may be installed outside or inside the chamber 610. The laser oscillator 630 should be installed so that a laser is provided at an upper part. Referring to FIG. 5 showing a schematic view of the laser oscillator, CW DN:YAG laser (1604 nm) is used as the laser oscillator in the described embodiment. The laser oscillator includes two galvano meter scanners 631 and 633, a scan lens 635, and a cylinder lens 636. However, the present invention is not limited thereto.

Hereinafter, a laser induced thermal imaging method for transferring an imaging layer of a donor film on an acceptor substrate using the aforementioned donor film and laser induced thermal imaging apparatus according to another aspect of the present invention will be explained with reference to FIGS. 6A to 6H. A laser induced thermal imaging method of the embodiment used in manufacturing organic light emitting diodes includes an acceptor substrate moving step, a donor film moving step, a laminating step, and a transfer step.

The acceptor substrate conveying (or transferring) step is a step of conveying (or transferring) the acceptor substrate 670 into the chamber 610 of the laser induced thermal imaging apparatus. Here, the acceptor substrate 670 can be conveyed in the chamber 610 by a feed mechanism of a robot arm 690 (shown in FIG. 6A). The acceptor substrate 670 conveyed in the chamber 610 is supported by the guide bars 643 ascended through the through holes 641 (see FIG. 6B). The guide bars 643 supporting the acceptor substrate 670 again descend to exactly position the acceptor substrate 670 in the mounting groove 621 of the substrate stage 620 (see FIG. 6C).

Figure 6D:
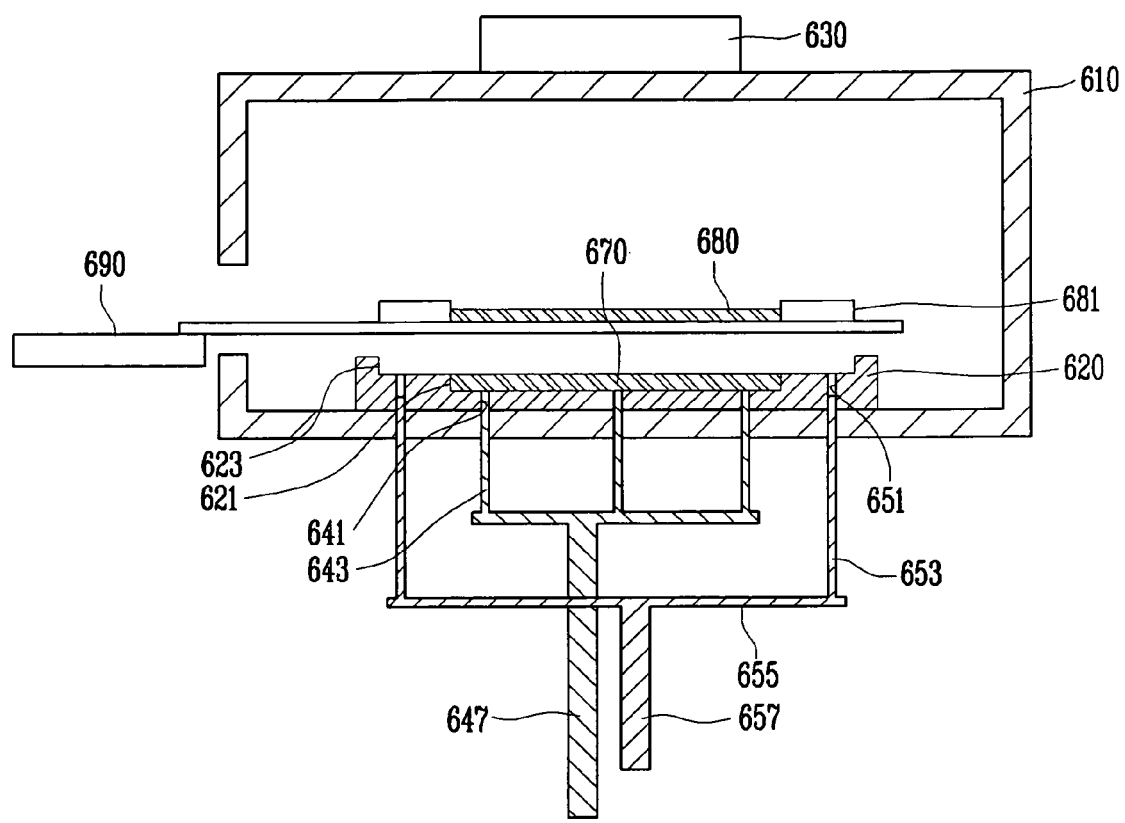
Figure 6E:
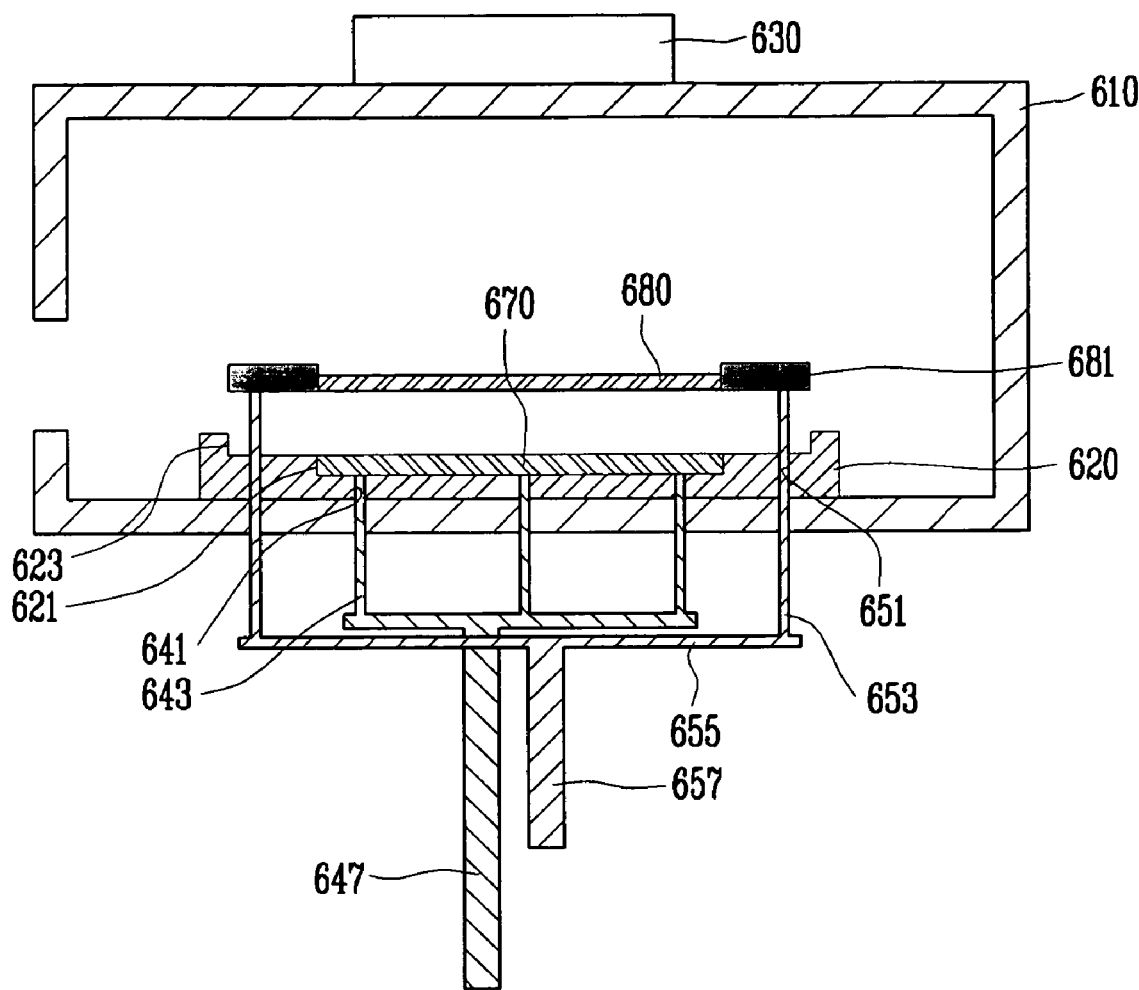
Figure 6F:
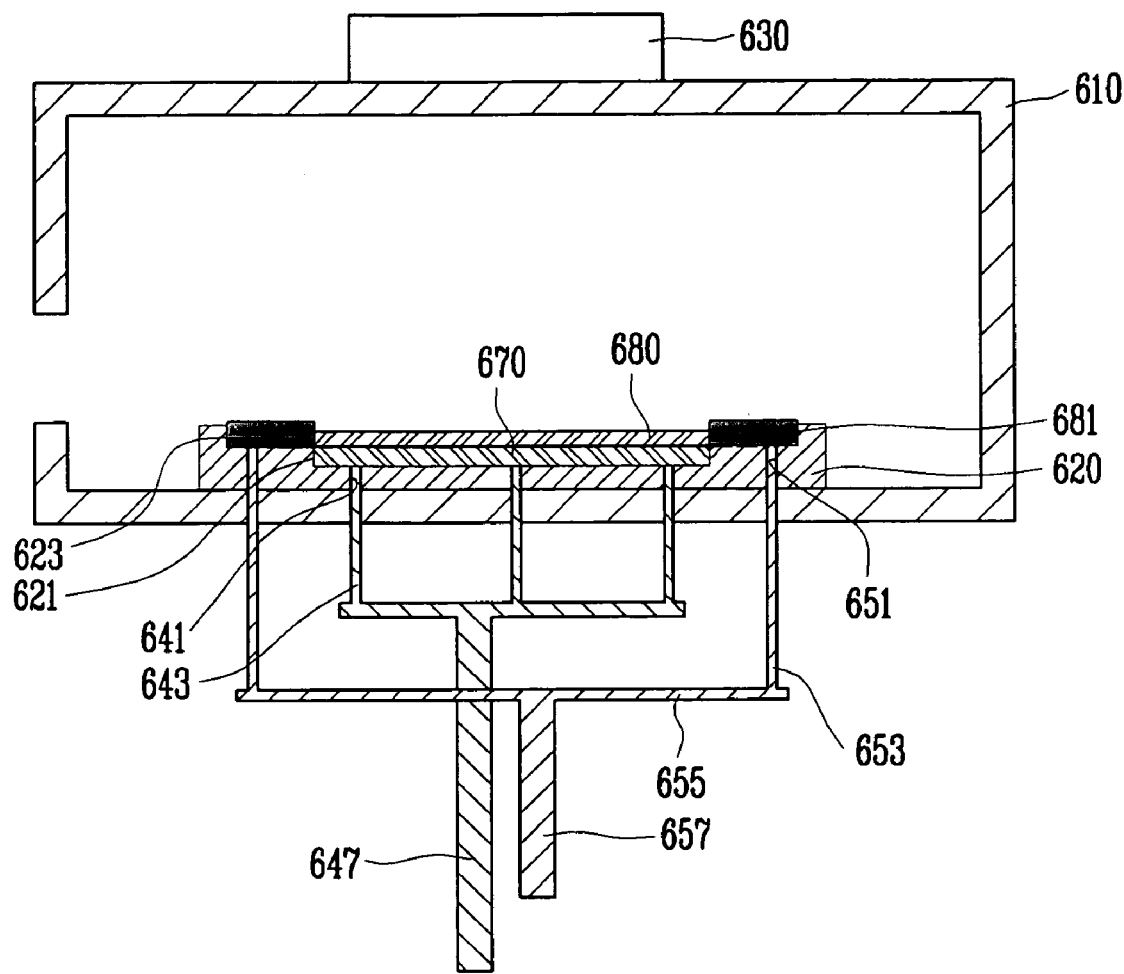
Figure 6G:
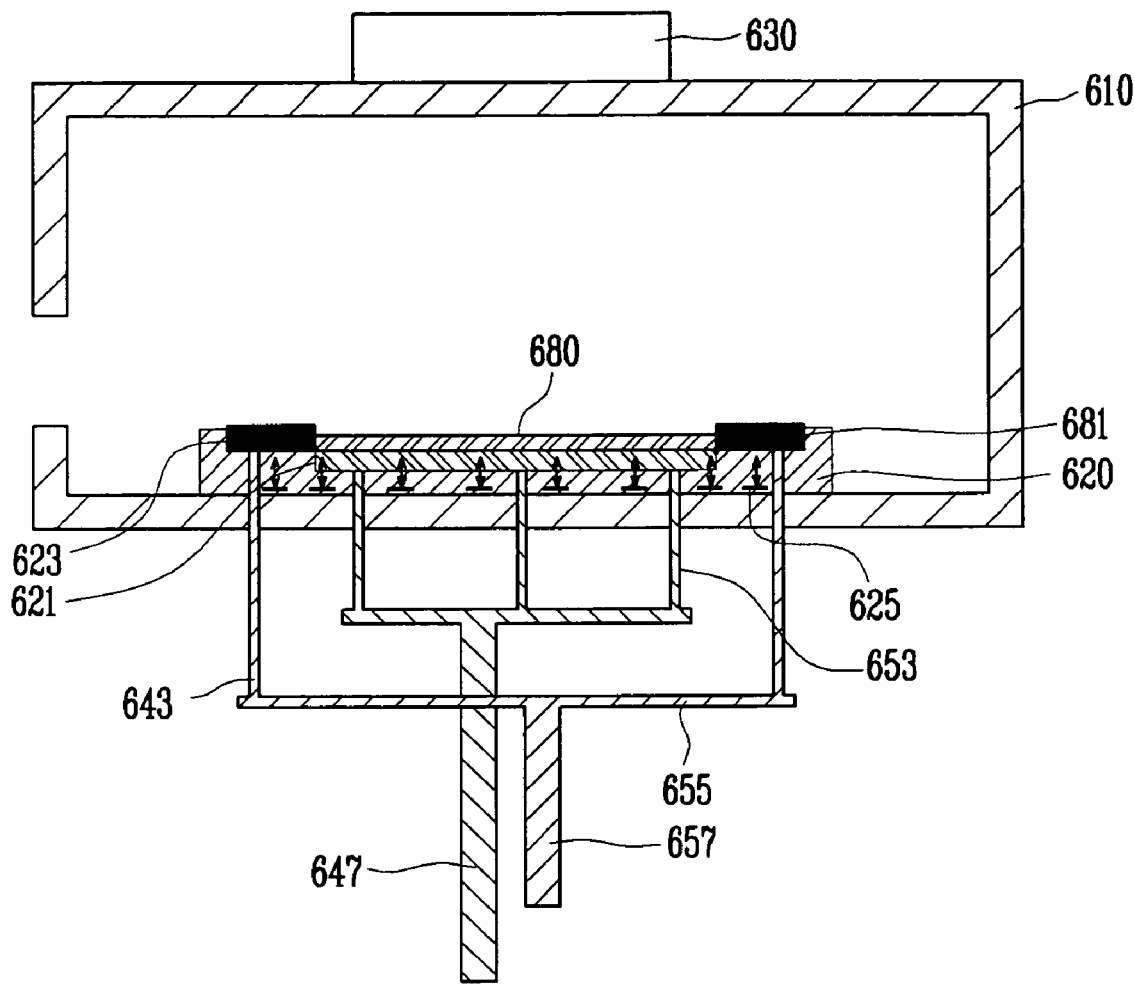
Figure 6H:
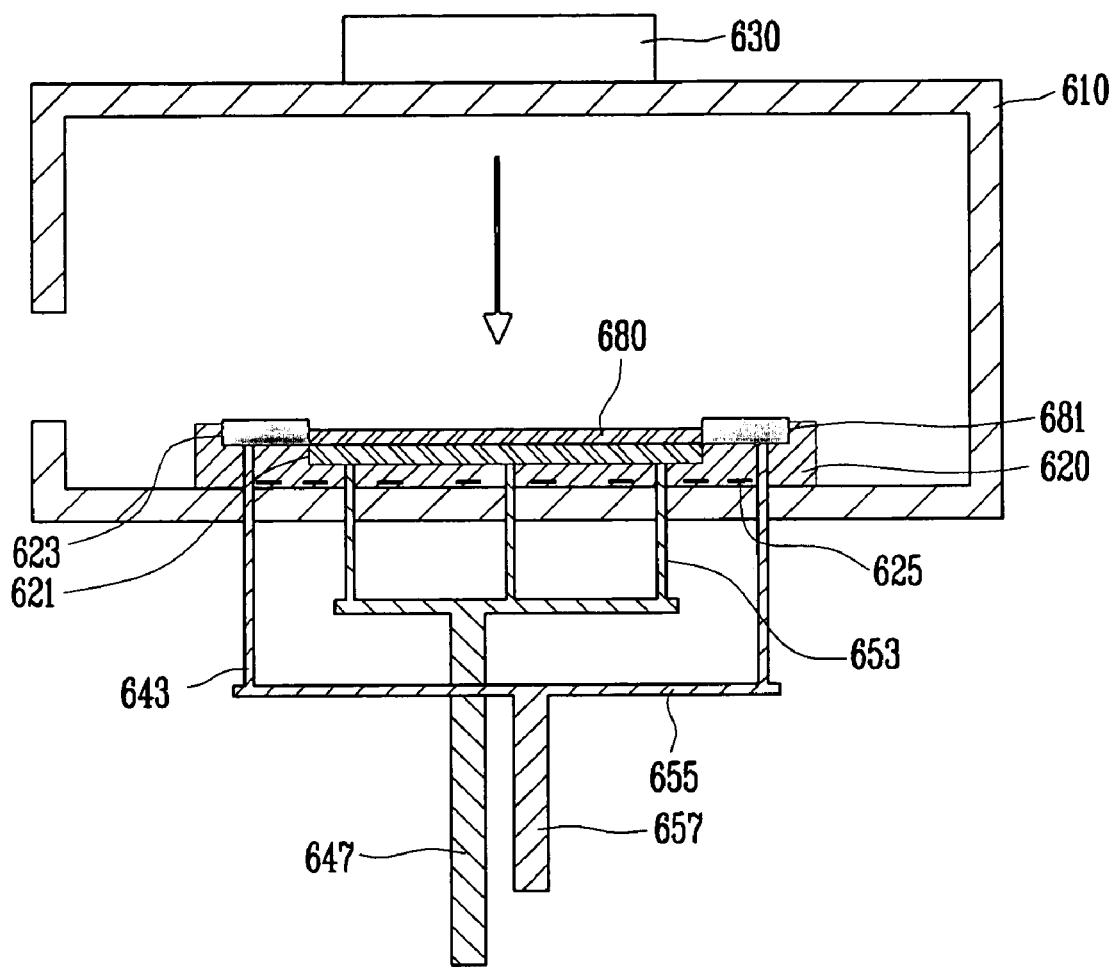

The donor film conveying (or transferring) step moves a donor film 680 into the chamber 610 using a feed mechanism such as the robot arm 690 as in the acceptor substrate conveying step (see FIG. 6D). In the described embodiment, the donor film 680 is mounted on a film tray 681 to move into the chamber 610. The donor film 680 conveyed in the chamber 610 is supported by the guide bars 653 ascended through the through holes 651 (see FIG. 6E). The guide bars 653 supporting the donor film 680 again descend to exactly position the donor film 680 in the mounting groove 623 of the substrate stage 620 (see FIG. 6F).

The laminating step applies a suitable power to the electromagnets 625 of the substrate stage 620 so that the permanent magnet included in the donor film 680 forms a magnetic attraction with the electromagnets of the substrate stage 620. This causes the donor film 680 to adhere closely to the acceptor substrate 670. At this time, since the chamber 610 is in a vacuum state, the occurrence of impurities or void (or space or gap) between the acceptor substrate 670 and the donor film 680 is reduced or minimized to increase transfer efficiency (see FIG. 6G).

The laminating of the donor film 680 and the acceptor substrate 670 can be achieved by various methods according to a shape of an electromagnet or electromagnets included in the substrate stage 620. For example, as shown in FIG. 4A, when the electromagnets of the substrate stage are concentrically disposed, a power is firstly applied to a first electromagnet defining an innermost concentric circle. In this state, a power is applied to a second electromagnet or electromagnets defining a second inner concentric circle outside the innermost concentric circle. Next, a power is applied to a third electromagnet or electromagnets defining a concentric circle outside the second inner concentric circle, with the result that the laminating is achieved while reducing or minimizing the occurrence of impurities or void between the acceptor substrate 670 and the donor film 680.

Furthermore, as shown in FIG. 4B, when a plurality of electromagnets of the substrate stage are disposed in transverse and longitudinal lines, a power is applied to only an electromagnet that a laser is irradiated or only electromagnets disposed in the corresponding line, such that a local laminating continues to be performed in the parts that the laser is irradiated. As a result, the laminating is achieved while reducing or minimizing the occurrence of impurities or void between the acceptor substrate 670 and the donor film 680.

In the transfer step, a laser irradiation device irradiates a laser on the donor film 680 laminated with the acceptor substrate 670 to transfer an organic emission layer formed on the donor film 680 at a pixel definition region (or pixel region) of the acceptor substrate 670. When the laser is irradiated, a photo-thermal conversion layer of the donor film 680 is expanded. Accordingly, an adjacent organic emission layer is expanded in a direction of the acceptor substrate to contact or adhere the organic emission layer to the acceptor substrate with the result that the transfer is completed (see FIG. 6H).

Figure 7:
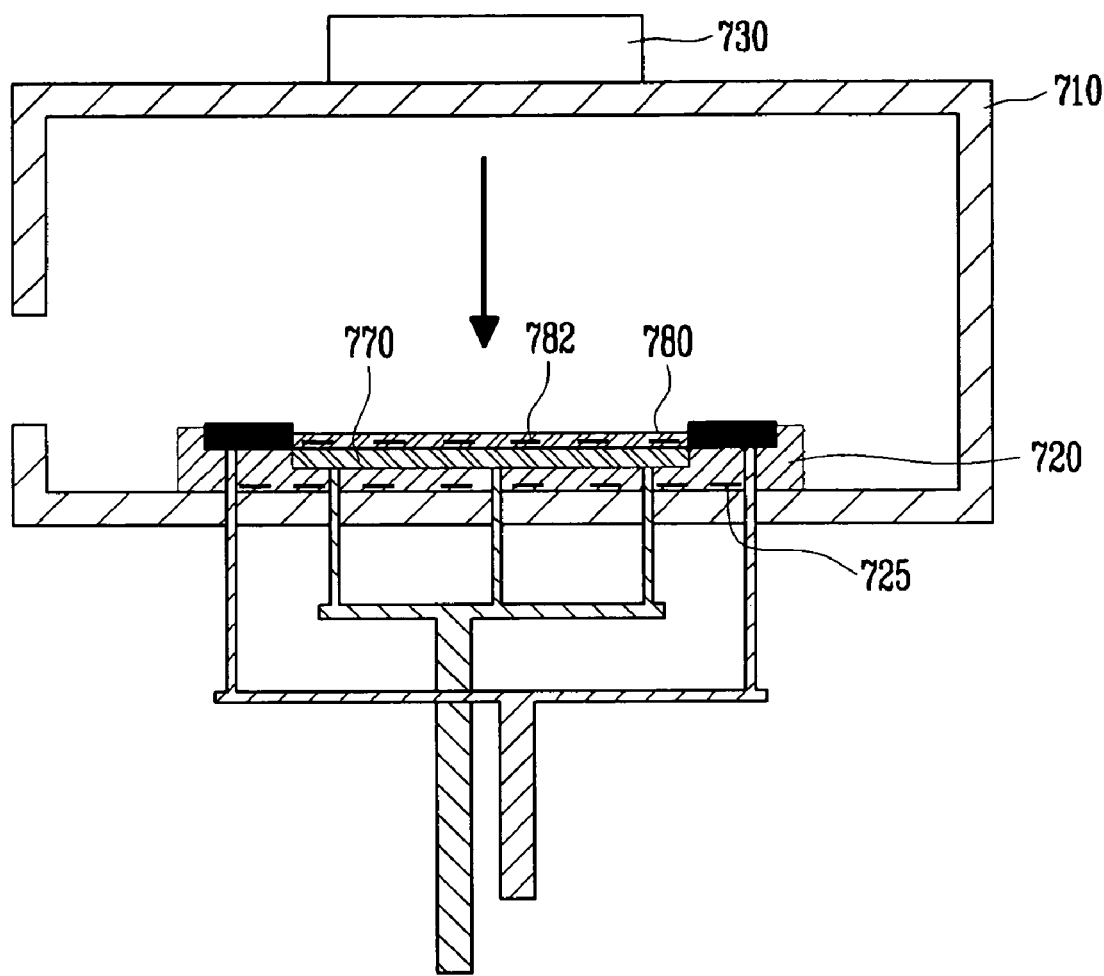
FIG. 7 is a cross-sectional view showing a construction of a laser induced thermal imaging apparatus according to a further embodiment of the present invention.

FIG. 7 is a cross-sectional view showing a laser induced thermal imaging apparatus according to another embodiment of the present invention. With reference to FIG. 7, the laser induced thermal imaging apparatus includes a chamber 710, a substrate stage 720, and a laser oscillator 730.

Here, the substrate stage 720 is provided with at least one second electromagnet 725. The second electromagnet 725 may be formed by a large plane magnet or a plurality of magnets. There is no limit to the arrangement pattern of the second electromagnet or electromagnets 725. However, in the described embodiment, the electromagnets 725 are concentrically formed or formed in a plurality of transverse and longitudinal lines to perform laminating.

Furthermore, a donor film 780 having a first electromagnet 782 is positioned on an acceptor substrate 770. Next, a suitable power is applied to the second electromagnet 725 and the first electromagnet 782 of the donor film 780, so that the first electromagnet of the donor film 780 forms a magnetic attraction with the electromagnet of the substrate stage, with the result that the donor film 780 and the acceptor substrate 770 are closely adhered to each other.

As described earlier, by inserting the first electromagnet 782 into the donor film 780, the donor film 782 is given or provided with a magnetic characteristic. When the first electromagnet 782 is positioned on or over the acceptor substrate, it forms a mutual magnetic attraction with the substrate stage 720 of a laser induced thermal imaging apparatus having the second electromagnet 725. Accordingly, the donor film 780 and the acceptor substrate 770 are closely adhered to each other by a magnetic force.

A detailed description for the elements and methods of FIG. 7 that are substantially the same as those of FIG. 3 and FIGS. 6A-6H, is omitted for clarity.

Figure 8:
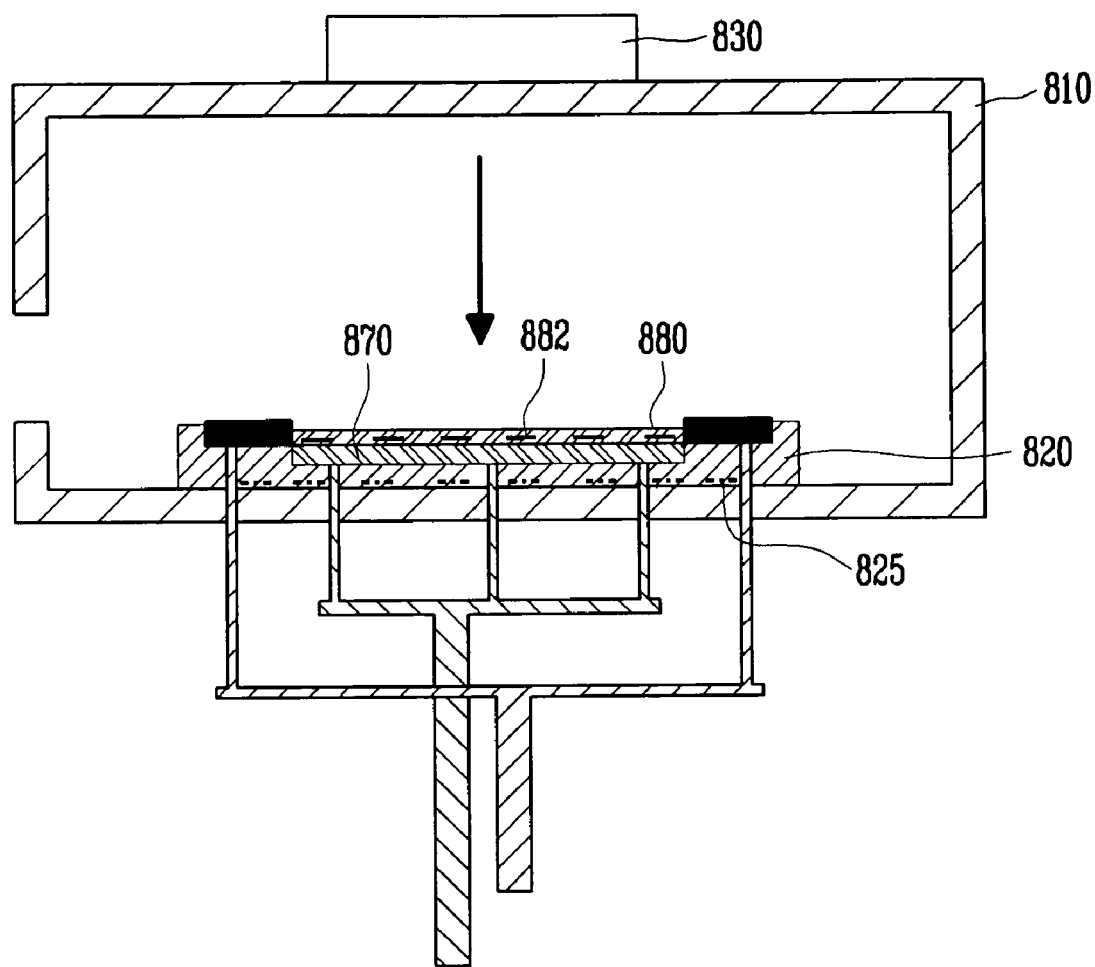
FIG. 8 is a cross-sectional view showing a construction of a laser induced thermal imaging apparatus according to a further embodiment of the present invention.

FIG. 8 is a cross-sectional view showing a laser induced thermal imaging apparatus according to another embodiment of the present invention. With reference to FIG. 8, the laser induced thermal imaging apparatus includes a chamber 810, a substrate stage 820, and a laser oscillator 830.

Here, the substrate stage 820 is provided with at least one permanent magnet 825. The permanent magnet or magnets 825 may be formed by a large plane magnet or a plurality of magnets. There is no limit to an arrangement pattern of the permanent magnet or magnets 825. However, in the described embodiment, the permanent magnets 825 are concentrically formed or formed in a plurality of transverse and longitudinal lines to perform laminating.

Furthermore, a donor film 880 having electromagnets 882 is positioned on an acceptor substrate 870. Next, a suitable power is applied to the electromagnets 882 of the donor film 880, so that the electromagnets of the donor film 880 form a magnetic attraction with the permanent magnet or magnets 825 of the substrate stage, with the result that the donor film 880 and the acceptor substrate 870 are closely adhered to each other.

As described earlier, by inserting the electromagnets 882 into the donor film 880, the donor film 880 is given or provided with a magnetic characteristic. When the electromagnets 882 are positioned on or over the acceptor substrate, they form a mutual magnetic attraction with the substrate stage 820 of the laser induced thermal imaging apparatus having the permanent magnet 825. Accordingly, the donor film 880 and the acceptor substrate 870 are closely adhered to each other by a magnetic force.

A detailed description for the elements and methods of FIG. 8 that are substantially the same as those of FIG. 3 and FIGS. 6A-6H, are omitted for clarity.

Figure 9:
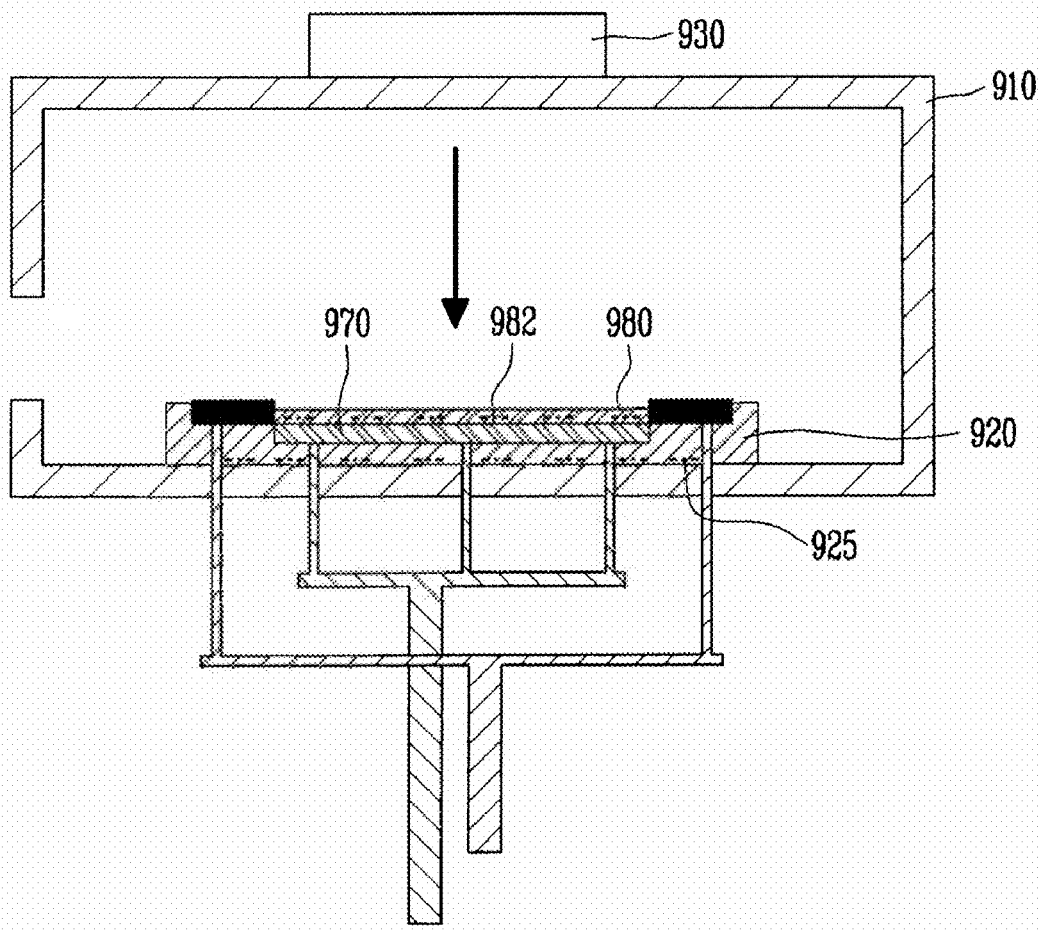
FIG. 9 is a cross-sectional view showing a construction of a laser induced thermal imaging apparatus according to a further embodiment of the present invention.

FIG. 9 is a cross-sectional view showing a laser induced thermal imaging apparatus according to another embodiment of the present invention. Referring to FIG. 9, the laser induced thermal imaging apparatus includes a chamber 910, a substrate stage 920, and a laser oscillator 930.

Here, the substrate stage 920 is provided with at least one permanent magnet 925. The permanent magnet or magnets 925 may be formed by a large plane magnet or a plurality of magnets. There is no limit to an arrangement pattern of the permanent magnet or magnets 925. However, in the described embodiment, the permanent magnets 925 are concentrically formed or formed in a plurality of transverse and longitudinal lines to easily perform laminating.

Further, a donor film 980 having a first permanent magnet or magnets 982 is positioned on an acceptor substrate 970. The first permanent magnet or magnets 982 are inserted into the donor film 980 to form a magnetic force with the permanent magnet or magnets 925 installed at the substrate stage 920 of the laser induced thermal apparatus. Alnicon magnet, ferrite magnet, rare-earth magnet, rubber magnet, or plastic magnet may be used as the first permanent magnet 982 in the described embodiment.

As describe above, by inserting the first permanent magnet or magnets 982 into the donor film 980, when the first permanent magnet or magnets 982 are positioned on or over the acceptor substrate 970, they form a mutual magnetic attraction with the substrate stage 920 of the laser induced thermal imaging apparatus having the permanent magnet 925. Accordingly, the donor film and the acceptor substrate 970 are closely adhered to each other by a magnetic force.

A detailed description for the elements and methods of FIG. 9 that are substantially the same as those of FIG. 3 and FIGS. 6A-6H, is omitted for clarity.

Although certain exemplary embodiments of the present invention have been shown and described, it would be appreciated by those skilled in the art that changes might be made in these embodiments without departing from the principles and spirit of the invention, the scope of which is defined in the claims and their equivalents. For example, as a method of including the permanent magnet in the donor film, additional organic layer or inorganic layer may be further formed, and the permanent magnet may be provided between the additional organic layer or inorganic layer, or a shape and a position of a substrate plate (or layer) having an electromagnet or electromagnets may be changed, without departing from the principles and spirit of the invention.

In accordance with the laser induced thermal imaging donor film and the laser induced thermal imaging apparatus and method of the present invention, a laminating is permitted between an acceptor substrate and a donor film substantially without the occurrence of impurities or void. Furthermore, since a laminating is also achieved between an acceptor substrate and a donor film in a vacuum state, when a previous process requires the vacuum state, all the previous processes can be performed in the vacuum state.

What is claimed is:

1. A laser induced thermal imaging donor film comprising:
   a base substrate;
   an imaging layer;
   a photo-thermal conversion layer between the base substrate and the imaging layer; and
   a magnet providing a magnetic characteristic to the laser induced thermal imaging donor film.

2. The laser induced thermal imaging donor film according to claim 1, further comprising a buffer layer between the photo-thermal conversion layer and the imaging layer.

3. The laser induced thermal imaging donor film according to claim 1, further comprising an inter layer between the photo-thermal conversion layer and the imaging layer.

4. The laser induced thermal imaging donor film according to claim 3, wherein the magnet comprises a permanent magnet layer between the base substrate and the imaging layer.

5. The laser induced thermal imaging donor film according to claim 4, wherein the permanent magnet layer is between the base substrate and the photo-thermal conversion layer.

6. The laser induced thermal imaging donor film according to claim 3, wherein the magnet comprises an electromagnet layer between the base substrate and the imaging layer.

7. The laser induced thermal imaging donor film according to claim 6, wherein the electromagnet layer is between the base substrate and the photo-thermal conversion layer.

8. The laser induced thermal imaging donor film according to claim 1, wherein the magnet is formed as a permanent magnet in at least one layer of the donor film in a form of minute particles.

9. The laser induced thermal imaging donor film according to claim 8, wherein the minute particles are in the base substrate or a buffer layer between the photo-thermal conversion layer and the imaging layer.

10. The laser induced thermal imaging donor film according to claim 8, wherein the minute particles comprise nano particles.

11. The laser induced thermal imaging donor film according to claim 1, wherein the imaging layer of the laser induced thermal imaging donor film is adapted to function as an emission layer of an organic light emitting diode.

12. The laser induced thermal imaging donor film according to claim 1, wherein the magnet comprises a permanent magnet or an electromagnet.

13. A laser induced thermal imaging method comprising:
    placing an acceptor substrate on a substrate stage having a first magnet;
    placing a laser induced thermal imaging donor film having a second magnet and an imaging layer on the acceptor substrate, at least one of the first magnet or the second magnet comprising at least one electromagnet;
    applying a power to the at least one electromagnet to laminate the donor film and the acceptor substrate; and
    irradiating a laser to the donor film to transfer the imaging layer on the acceptor substrate.

14. The method according to claim 13, wherein the at least one electromagnet comprises a plurality of electromagnets, and said applying the power comprises applying the power to the electromagnets concentrically located on the substrate stage or the donor film from inner electromagnets of the plurality of electromagnets to outer electromagnets of the plurality of electromagnets to laminate the donor film and the acceptor substrate from an inner portion to an outer portion.

15. The method according to claim 13, wherein the at least one electromagnet comprises a plurality of electromagnets, and said applying the power comprises applying the power to the electromagnets located on the substrate stage or the donor film in transverse and longitudinal lines according to a path of the laser to laminate the donor film and the acceptor substrate.

16. The method according to claim 13, wherein said placing the laser induced thermal imaging donor film comprises placing the donor film mounted on a film tray.

17. The method according to claim 13, wherein the first magnet comprises the at least one electromagnet, and the second magnet comprises an electromagnet, the method further comprising applying a power to the electromagnet of the donor film to laminate the donor film and the acceptor substrate.

18. The method according to claim 13, wherein the first magnet comprises at least one permanent magnet, and the second magnet comprises the at least one electromagnet.

19. A method for fabricating an organic light emitting diode having an emission layer formed between a first electrode and a second electrode by a laser induced thermal method, the method comprising:
    placing an acceptor substrate having a pixel region on a substrate stage having a first magnet;
    placing a donor film having a second magnet and an organic emission layer on the acceptor substrate, at least one of the first magnet or the second magnet comprising at least one electromagnet;
    applying a power to the at least one electromagnet to laminate the donor film and the acceptor substrate; and
    irradiating a laser to the donor film to transfer the organic emission layer on the pixel region of the acceptor substrate.

20. The method of claim 19, wherein at least one of the first magnet or the second magnet comprises a permanent magnet.

21. A laser induced thermal imaging method for irradiating a laser to a laser induced thermal imaging donor film having an imaging layer to transfer the imaging layer on an acceptor substrate, the method comprising:
    placing the acceptor substrate on a substrate stage having at least one first permanent magnet;
    placing the donor film having a second permanent magnet on the acceptor substrate;
    laminating the acceptor substrate utilizing a magnetic force formed between the at least one first permanent magnet and the second permanent magnet; and
    irradiating the laser to the donor film to transfer the imaging layer on the acceptor substrate.

22. The method according to claim 21, wherein said placing the laser induced thermal imaging donor film comprises placing the donor film mounted on a film tray.

* * * * *